United States Patent
Ko et al.

(10) Patent No.: US 7,511,348 B2
(45) Date of Patent: Mar. 31, 2009

(54) MOS TRANSISTORS WITH SELECTIVELY STRAINED CHANNELS

(75) Inventors: Chih-Hsin Ko, Fongshan (TW); Wen-Chin Lee, Hsin-Chu (TW); Chung-Hu Ke, Taipei (TW); Hung-Wei Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/717,450

(22) Filed: Mar. 13, 2007

(65) Prior Publication Data

US 2008/0224225 A1 Sep. 18, 2008

(51) Int. Cl.
*H01L 29/76* (2006.01)
(52) U.S. Cl. ............... 257/371; 257/382; 257/392; 257/18; 257/E27.062; 257/E27.064
(58) Field of Classification Search ............ 257/371, 257/E27.062
See application file for complete search history.

(56) References Cited

U.S. PATENT DOCUMENTS

| | | | |
|---|---|---|---|
| 6,890,808 B2 * | 5/2005 | Chidambarrao et al. | 438/199 |
| 2004/0253776 A1 | 12/2004 | Hoffmann et al. | |
| 2007/0090395 A1 * | 4/2007 | Sebe et al. | 257/144 |

OTHER PUBLICATIONS

Thompson, S. E., et al. "A 90-nm Logic Technology Featuring Strained-Silicon," IEEE Transactions on Electron Devices, vol. 51, No. 11, Nov. 2004, pp. 1790-1797.
Ge, C.-H., et al., "Process-Strained Si (PSS) CMOS Technology Featuring 3D Strain Engineering," 2003 IEEE, 4 pp.
Pidin, S., et al., "MOSFET Current Drive Optimization Using Silicon Nitride Capping Layer for 65-nm Technology Node," 2004 Symposium on VLSI Technology Digest of Technical Papers, IEEE, pp. 54-55.

* cited by examiner

*Primary Examiner*—Tu-Tu V Ho
(74) *Attorney, Agent, or Firm*—Slater & Matsil, L.L.P.

(57) ABSTRACT

The channels of first and second CMOS transistors can be selectively stressed. A gate structure of the first transistor includes a stressor that produces stress in the channel of the first transistor. A gate structure of the second transistor is disposed in contact with a layer of material that produces stress in the channel of the second transistor.

9 Claims, 5 Drawing Sheets

MOS TRANSISTORS WITH SELECTIVELY STRAINED CHANNELS

FIELD OF THE INVENTION

The invention relates generally to semiconductor integrated circuits and, more particularly, to strained channel transistors in semiconductor integrated circuits.

BACKGROUND OF THE INVENTION

It is well known in the semiconductor art that the performance of MOS transistors can be enhanced by creating a suitable strain (also referred to herein as stress) in the channel region, thereby producing a so-called strained channel transistor. For example, the performance of an n-channel transistor can be enhanced by creating a tensile strain in the channel region of the transistor, and the performance of a p-channel transistor can be enhanced by creating a compressive strain in the channel region of the transistor.

Some conventional strained channel transistors use a high-stress capping layer covering the transistors to create the desired stress. Other conventional strained channel transistors use silicide stressors on the gate structure to create the desired stress. The use of silicide stressors on the gate structure is described, for example, in U.S. Pat. No. 6,890,808, which is incorporated herein by reference.

In semiconductor integrated circuits that use complementary MOS (CMOS) transistor pairs, it is desirable to provide compressive strain in the channel region of the p-channel transistor, and tensile strain in the channel region of the n-channel transistor, thereby enhancing the performance of both types of transistors. However, with conventional approaches, it is relatively difficult to produce a CMOS transistor pair wherein the channel region of the p-channel transistor is subject to compressive strain, and the channel region of the n-channel transistor is subject to tensile strain.

It is therefore desirable to provide improved capabilities for producing semiconductor integrated circuits wherein the transistor channels are stressed in tension or compression as desired.

SUMMARY OF THE INVENTION

According to exemplary embodiments of the invention, the channels of first and second transistors can be selectively stressed. A gate structure of the first transistor includes a stressor that produces stress in the channel of the first transistor, and a gate structure of the second transistor is disposed in contact with a layer of material that produces stress in the channel of the second transistor.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION

Exemplary embodiments of the invention can optimize the performance of n-channel and p-channel transistors by engineering the nature and magnitude of the strain in the channel regions of the transistors. As mentioned above, it is desirable to induce a longitudinal (i.e., in the source-to-drain direction) tensile strain in the channel of an n-channel transistor. It is also desirable to induce a longitudinal compressive strain in the channel of a p-channel transistor. According to some embodiments of the invention, poly-silicide on the gate electrode induces longitudinal compressive stress in the channel of a p-channel transistor, and a tensile capping layer induces longitudinal tensile stress in the channel of an n-channel transistor. An example of this is shown in FIG. 1.

Figure 1:
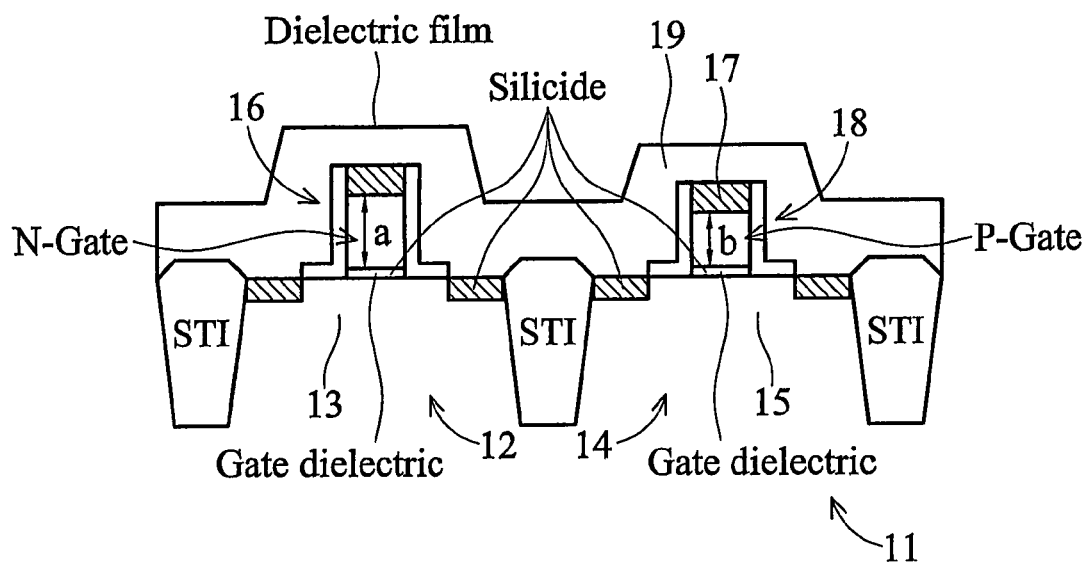
FIG. 1 diagrammatically illustrates a semiconductor integrated circuit apparatus according to exemplary embodiments of the invention.

In the structure of FIG. 1, an n-channel transistor 12 and a p-channel transistor 14 respectively include an p-type well 13 and a n-type well 15. The wells 13 and 15 are formed in a semiconductor substrate 11, and are isolated from one another by isolation structures STI (shallow trench isolation). The gate structure 18 of transistor 14 includes a silicide disposed on the gate electrode (P-gate) of transistor 14. The gate structure 16 of transistor 12 has a construction similar to that of the gate structure 18, but the gate electrode (N-gate) of gate structure 16 extends to a greater height above the substrate 11 than does the gate electrode (P-gate).

In particular, the gate electrode (N-gate) has a height of "a", and the gate electrode P-gate has a height of "b", where b<a. In some embodiments, the height "a" of the N-gate electrode is at least approximately 200 angstroms greater than the height "b" of the P-gate electrode. This difference in height can be achieved by over-etching the P-gate electrode. As described, for example, in aforementioned U.S. Pat. No. 6,890,808, a silicide formed on an over-etched gate electrode (such as the electrode P-gate in FIG. 1) acts as a stressor, and produces a longitudinal compressive stress in the channel (such as p-type channel 15 in FIG. 1) of that transistor.

Also in FIG. 1, a capping layer 19 (a dielectric film in some embodiments) is disposed in generally overlying, surrounding and contacting relationship with respect to the gate structures 16 and 18. It is known in the art that a capping layer such as layer 19 can be used to induce a desired stress (tensile or compressive) in an underlying transistor channel. In some embodiments, the capping layer 19 of FIG. 1 induces a longitudinal tensile stress in the p-type well 13. Accordingly, by virtue of the combination of the capping layer 19 and the stressor 17 (e.g., the illustrated silicide) on the over-etched gate electrode P-gate, exemplary embodiments of the invention can produce longitudinal compressive stress in the n-type well 15 and longitudinal tensile stress in the p-type well 13.

FIGS. 2-10 diagrammatically illustrate various operations that can be performed in the process of producing the structure of FIG. 1 according to exemplary embodiments of the invention. Initially, n-type doped and p-type doped wells are formed (not explicitly shown) in semiconductor substrate 11 as active regions for the n-channel and p-channel transistors 12 and 14, respectively. This is followed by gate dielectric formation, as illustrated generally in FIG. 2. In various embodiments, the gate dielectric may be formed by thermal oxidation, thermal oxidation followed by nitridation, chemical vapor deposition, sputtering, or other techniques known and used in the art for forming transistor gate dielectrics. In various embodiments, the gate dielectric includes a conventional material such as silicon dioxide or silicon oxynitride, with thicknesses ranging from approximately 8 angstroms (A) to approximately 100 angstroms. In some such embodiments, the gate oxide thickness is in a range from approximately 8 angstroms to approximately 10 angstroms. In various embodiments, the gate dielectric includes a high permittivity (high-k) material, with equivalent oxide thicknesses ranging from approximately 8 angstroms to approximately 100 angstroms. In various embodiments, the high-k material includes aluminum oxide $Al_2O_3$, hafnium oxide $HfO_2$, zirconium oxide $ZrO_2$, hafnium oxynitride HfON, hafnium silicate $HfSiO_4$, zirconium silicate $ZrSiO_4$, and lanthanum oxide $La_2O_3$.

Figure 2:
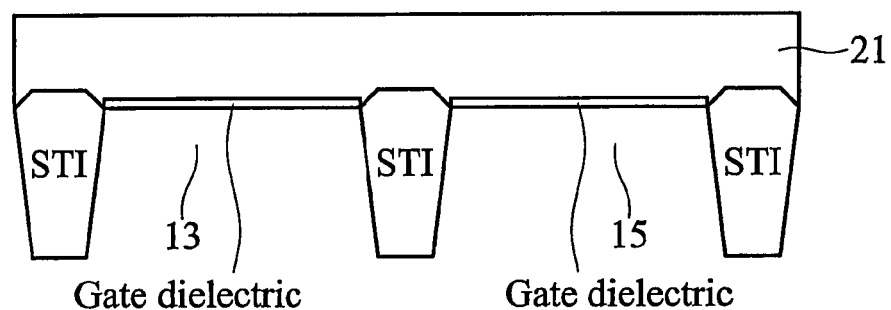
FIG. 2 diagrammatically illustrates a gate electrode deposition operation that can be used in the production of the apparatus of FIG. 1 according to exemplary embodiments of the invention.

After the gate dielectric has been formed, the gate electrode material 21 is deposited as shown in FIG. 2. The gate electrode material 21 is electrically isolated from the semiconductor substrate 11 by the gate dielectric. In various embodiments, the gate electrode material includes polycrystalline-silicon (poly-Si), poly-crystalline silicon-germanium (poly-SiGe), a refractory metal such as molybdenum and tungsten, compounds such as titanium nitride, and other conducting materials. In some embodiments, the gate electrode material is poly-Si and the gate dielectric is silicon oxynitride. In some embodiments, implants known as workfunction implants are introduced in the gate electrode material to alter the workfunction of the electrode.

Figure 3:
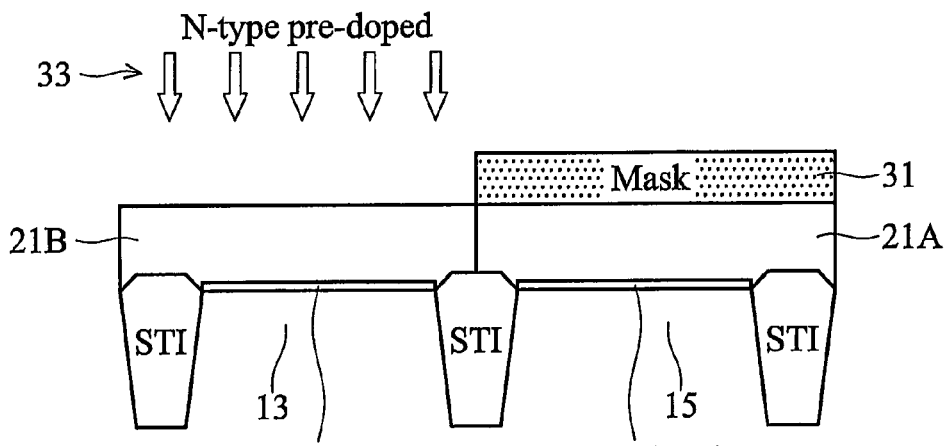
FIGS. 3 and 4 diagrammatically illustrate gate implantation operations that can be used in the production of the apparatus of FIG. 1 according to exemplary embodiments of the invention.
Figure 4:
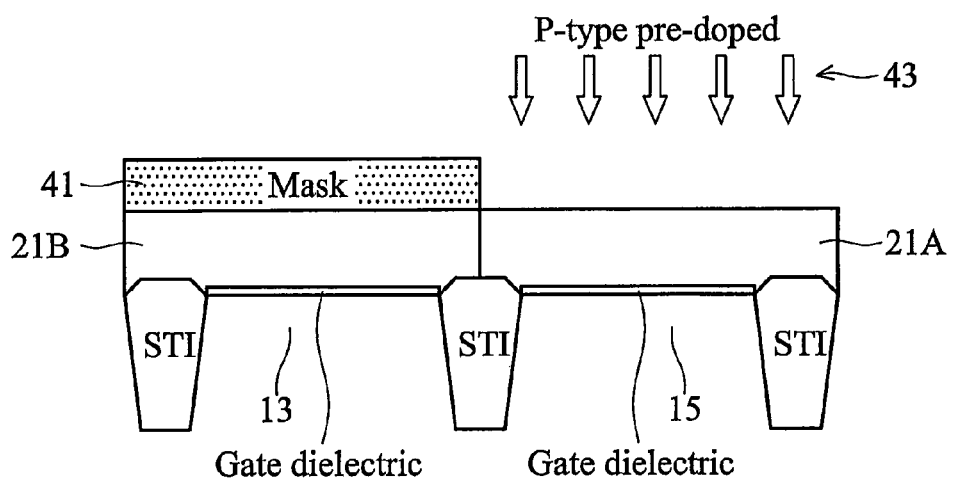

As shown in FIG. 3, a gate mask 31 is deposited over the portion 21A of the electrode material 21 associated with the p-channel transistor 14. Thereafter, n-type gate electrode implantation is performed as shown generally at 33 in FIG. 3. Thereafter, as can be seen from FIG. 4, the gate mask 31 is removed, and a gate mask 41 is deposited over the portion 21B of the gate electrode material 21 associated with the n-channel transistor 12. Then, p-type gate electrode implantation (using e.g., B, Ga or In) is performed as shown generally at 43.

Figure 5:
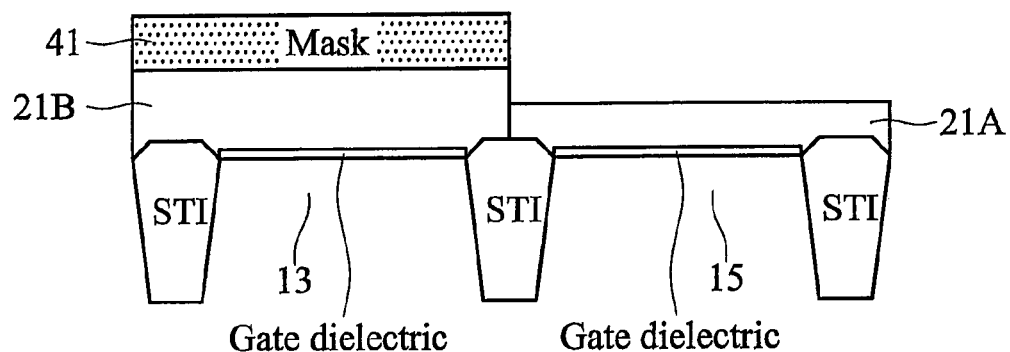
FIG. 5 diagrammatically illustrates a gate etch operation that can be used in the production of the apparatus of FIG. 1 according to exemplary embodiments of the invention.
Figure 6:
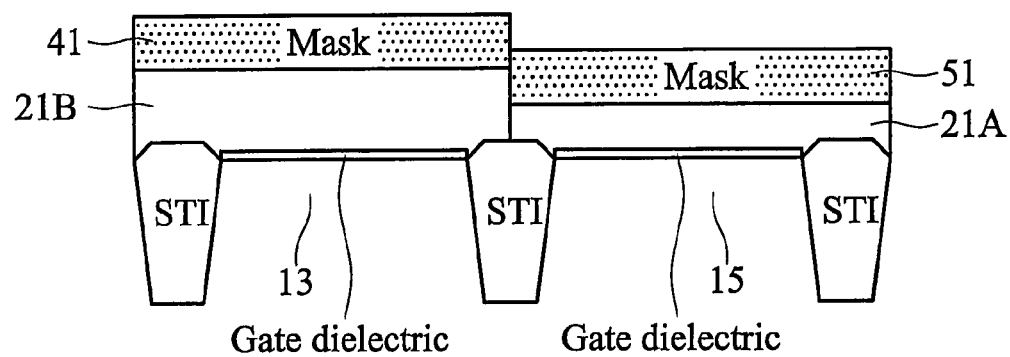
FIG. 6 diagrammatically illustrates hard mask deposition operation that can be used in the production of the apparatus of FIG. 1 according to exemplary embodiments of the invention.
Figure 7:
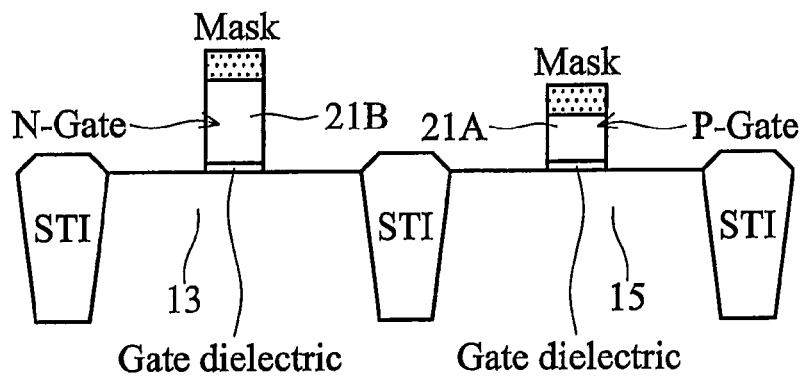
FIG. 7 diagrammatically illustrates the structure produced by patterning and gate formation operations that can be used in the production of the apparatus of FIG. 1 according to exemplary embodiments of the invention.

After the p-type gate implant operation, the portion 21A of gate electrode material 21 is etched back by using reactive ion etching (RIE), as shown in FIG. 5. The range of thickness of the p-type electrode is between 200 A and 1200 A and the range of the ratio between the thickness of the PMOS electrode and the NMOS electrode is from 1/5 to 4/5. The preferred thickness of p-type electrode is 50 nm, and the ratio between the thickness of the PMOS gate electrode and NMOS electrode is 1/2. After etching of the portion 21A of the gate electrode material, a mask 51 is deposited on the etched portion 21A, as shown in FIG. 6. Patterning and etching are then applied in generally conventional fashion to produce the gate electrodes P-gate and N-gate. The resulting structure is shown in FIG. 7. The patterning operation (e.g., photoresist patterning) defines the gate electrodes, and the etching operation forms the gate electrodes. In some embodiments, a plasma etch using chlorine and bromine chemistry is used to etch the gate electrode material with a high etch selectivity with respect to the gate dielectric.

Figure 8:
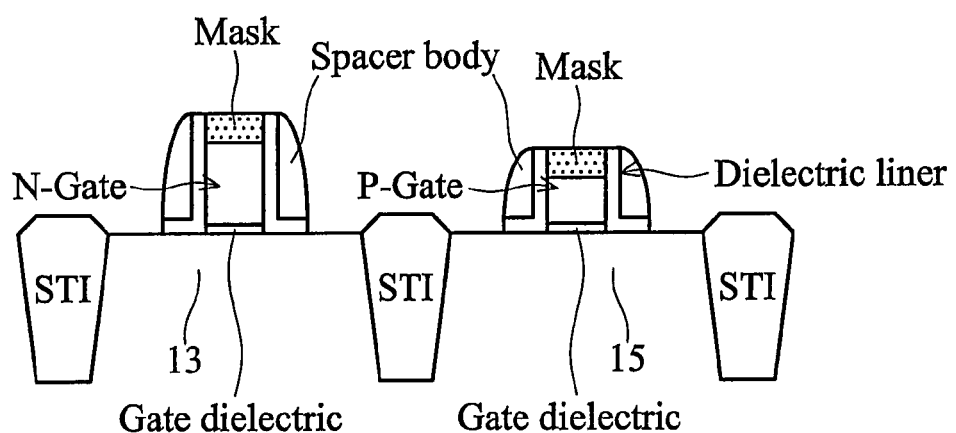
FIG. 8 diagrammatically illustrates a spacer formation operation that can be used in the production of the apparatus of FIG. 1 according to exemplary embodiments of the invention.

After the formation of the gate electrodes, the source and drain extension regions and the pocket regions are formed (not explicitly shown). In various embodiments, this is achieved by ion implantation, plasma immersion ion implantation (PIII), and other techniques known and used in the art. Next, dielectric liners and spacer bodies are formed on the sidewalls of the gate electrode by deposition and selective etching of the spacer material to give a cross-section as shown in FIG. 8. In some embodiments, the spacer material includes a dielectric material such as silicon nitride or silicon dioxide. The spacer formation operation is followed by implantation of deep source and drain regions (not explicitly shown).

Figure 9:
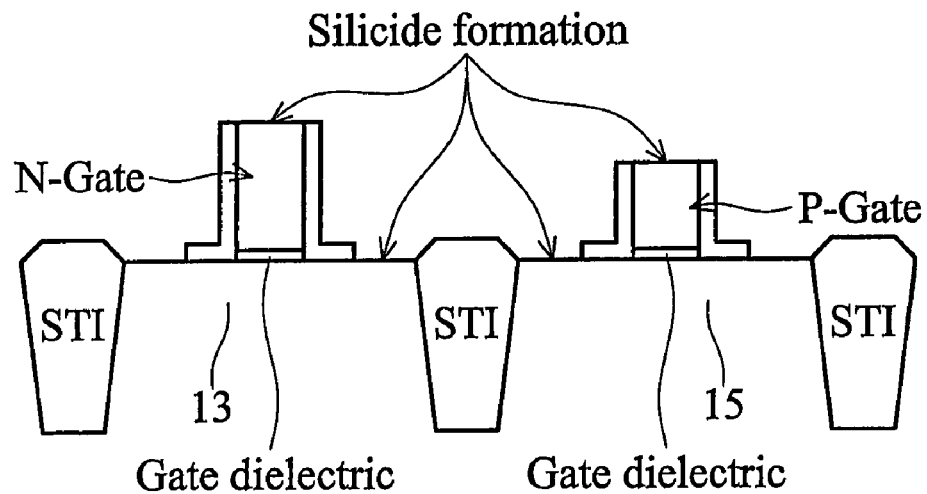
FIG. 9 diagrammatically illustrates the structure that remains after removing the spacers of FIG. 8 according to exemplary embodiments of the invention.
Figure 10:
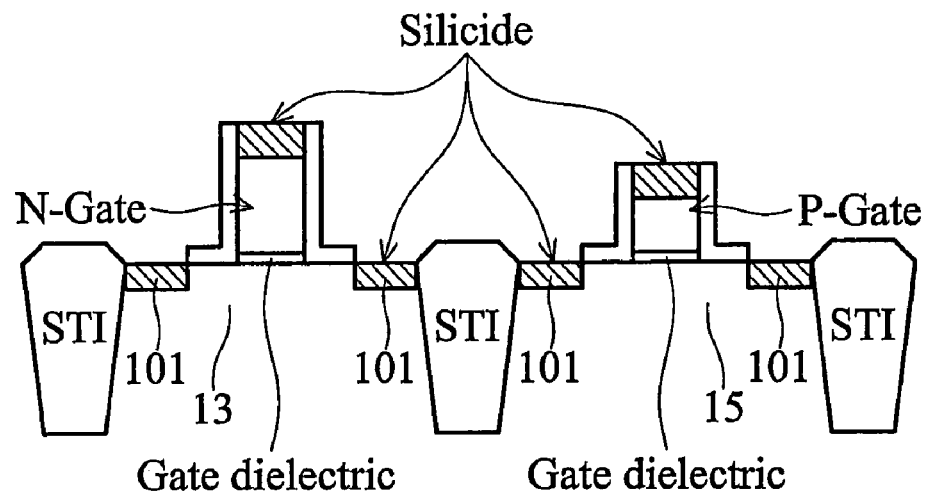
FIG. 10 diagrammatically illustrates a silicide formation operation that can be used in the production of the apparatus of FIG. 1 according to exemplary embodiments of the invention.

After source and drain implantation, the spacer body is removed, as shown in FIG. 9. Thereafter, in some embodiments, a silicide process is used to form silicide at various locations as shown in FIG. 9. In some embodiments, the conductive material for the silicide process is formed using a self-aligned silicide process, also known as a salicide process. In some embodiments, another metal deposition process is used to form the conductive material for the silicide. The silicide material forms on the source and drain regions 101, and on the gate electrodes N-gate and P-gate, as shown in FIG. 10. The silicide formation on the gate electrodes N-gate and P-gate completes the respective gate structures 16 and 18 of the transistors 12 and 14 (see also FIG. 1).

Next, the capping layer 19 of FIG. 1 is formed over the transistors 12 and 14. In some embodiments, the capping layer 19 is a high-stress film, for example, silicon nitride or any other suitable high-stress material. In various embodiments, the stress imparted by the capping layer 19 is either compressive or tensile in nature, and has a magnitude ranging from approximately 0.1 to approximately 4 giga-pascals (GPa). In some embodiments, the high-stress film is formed by a chemical vapor deposition (CVD) process, for example, a low-pressure CVD (LPCVD) process or a plasma-enhanced CVD (PECVD) process, as commonly known and used in the art. After formation of the capping layer 19, contact etch, metallization and passivation (not explicitly shown) are performed to complete the device, as is conventional.

Although exemplary embodiments of the invention have been described above in detail, this does not limit the scope of the invention, which can be practiced in a variety of embodiments.

What is claimed is:

1. A semiconductor integrated circuit apparatus, comprising:
   a semiconductor substrate;
   a first transistor, including a first well formed in said semiconductor substrate, and a first gate structure disposed on said semiconductor substrate and extending away from said semiconductor substrate, said first gate structure including a first gate electrode overlying said first well, and said first gate structure further including a stressor that produces a first stress in said first well, said first gate electrode disposed between said stressor and said semiconductor substrate;

a second transistor, including a second well formed in said semiconductor substrate, and a second gate structure disposed on said semiconductor substrate and extending away from said semiconductor substrate, said second gate structure including a second gate electrode having a uniform composition overlying said second well, and said second gate electrode extending further from said semiconductor substrate than said first gate electrode; and a layer of material disposed in contact with said first gate structure and said second gate structure, said layer of material producing a second stress in said second well, the second stress having an opposite type of stress than the first stress.

2. The apparatus of claim 1, wherein said first stress is a compressive stress.

3. The apparatus of claim 2, wherein said second stress is a tensile stress.

4. The apparatus of claim 1, wherein said layer of material includes a dielectric material.

5. The apparatus of claim 1, wherein said second gate structure extends at least approximately 200 angstroms further away from said semiconductor substrate than does said first gate structure.

6. The apparatus of claim 1, wherein said stressor is disposed in contact with said first gate electrode.

7. The apparatus of claim 6, wherein said stressor includes a silicide material formed on said first gate electrode.

8. The apparatus of claim 7, wherein said second gate structure includes a silicide material formed on said second gate electrode opposite said semiconductor substrate.

9. The apparatus of claim 1, wherein said first transistor is a p-channel transistor and said second transistor is an n-channel transistor.

* * * * *